United States Patent
Funahashi

(10) Patent No.: US 10,236,228 B2
(45) Date of Patent: Mar. 19, 2019

(54) ELECTRONIC COMPONENT MOUNTING BOARD, ELECTRONIC DEVICE, AND ELECTRONIC MODULE

(71) Applicant: KYOCERA Corporation, Kyoto-shi, Kyoto (JP)

(72) Inventor: Akihiko Funahashi, Kagoshima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/882,330

(22) Filed: Jan. 29, 2018

(65) Prior Publication Data

US 2018/0308777 A1    Oct. 25, 2018

(30) Foreign Application Priority Data

Apr. 25, 2017    (JP) ................. 2017-086407

(51) Int. Cl.
| H01L 21/48 | (2006.01) |
| H01L 23/00 | (2006.01) |
| H01L 23/13 | (2006.01) |
| H01L 33/48 | (2010.01) |
| H01L 33/62 | (2010.01) |
| H01L 23/053 | (2006.01) |
| H01L 23/373 | (2006.01) |
| H01L 23/498 | (2006.01) |
| H01L 23/544 | (2006.01) |
| H01L 27/146 | (2006.01) |

(52) U.S. Cl.
CPC ........ *H01L 23/053* (2013.01); *H01L 21/4857* (2013.01); *H01L 23/13* (2013.01); *H01L 23/49811* (2013.01); *H01L 27/14618* (2013.01); *H01L 27/14636* (2013.01); *H01L 33/486* (2013.01); *H01L 33/62* (2013.01); *H01L 23/3735* (2013.01); *H01L 23/49822* (2013.01); *H01L 23/49838* (2013.01); *H01L 23/544* (2013.01); *H01L 24/16* (2013.01); *H01L 24/48* (2013.01); *H01L 2223/54426* (2013.01); *H01L 2224/16227* (2013.01); *H01L 2224/48091* (2013.01); *H01L 2224/48227* (2013.01); *H01L 2924/12041* (2013.01); *H01L 2924/14* (2013.01)

(58) Field of Classification Search
CPC ............ H01L 51/56; H01L 2251/5338; H01L 51/5016; H01L 51/0097; H01L 51/0072
USPC ........................................................ 257/690
See application file for complete search history.

(56) References Cited

U.S. PATENT DOCUMENTS

2018/0035028 A1* 2/2018 Wang .................... H04N 5/2257

FOREIGN PATENT DOCUMENTS

JP    2005-340539 A    12/2005

* cited by examiner

*Primary Examiner* — Andy Huynh
(74) *Attorney, Agent, or Firm* — Volpe and Koenig, P.C.

(57) ABSTRACT

An electronic component mounting board reduces shadows produced along its perimeter to improve the mountability of an electronic device and an electronic module. An electronic component mounting board (1) includes a substrate (2a) including a mount area (4) in which an electronic component (10) is mountable. The substrate (2a) includes electrode pads located at ends of the mount area (4) as viewed from above. The electronic component mounting board (1) includes a frame (2b) located outside the electrode pads (3) on the upper surface of the substrate (2a). The frame (2b) includes at least one side surface that slopes from an upper end to a lower end of the frame (2b), and flares from the upper end to the lower end as viewed from above.

12 Claims, 7 Drawing Sheets

ELECTRONIC COMPONENT MOUNTING BOARD, ELECTRONIC DEVICE, AND ELECTRONIC MODULE

BACKGROUND

1. Technical Field

The present invention relates to a mounting board on which an electronic component, such as an imaging device including a charge-coupled device (CCD) or a complementary metal oxide semiconductor (CMOS) device, a light-emitting device including a light emitting diode (LED), or an integrated circuit is mounted, and to an electronic device and an electronic module.

2. Description of the Background

An electronic component mounting board including a wiring board formed from insulating layers is known. An electronic device containing such an electronic component mounting board and an electronic component mounted on the mounting board is also known (refer to Japanese Unexamined Patent Application Publication No. 2005-340539).

Japanese Unexamined Patent Application Publication No. 2005-340539 describes an insulating board having chamfered edges where its upper surface and side surfaces meet to reduce chips or cracks in the edges under an external force applied when a lens fastener is bonded to the board, an imaging device is mounted on the board, or the board is transported. However, the insulating board having only chamfered edges between the upper surface and the side surfaces described in Japanese Unexamined Patent Application Publication No. 2005-340539 can easily be shadowed when illuminated with light. The shadowed portion may be misrecognized as the profile line of the insulating board in, for example, image recognition for transporting the insulating board or in recognition of the outer edges of the insulating board for mounting an electronic component.

BRIEF SUMMARY

An electronic component mounting board according to one aspect of the present invention includes a substrate having an upper surface including a mount area in which an electronic component is mountable, electrode pads located at ends of the mount area as viewed from above, and a frame located outside the electrode pads on the upper surface of the substrate. The frame includes at least one side surface that slopes from an upper end to a lower end of the frame and flare from the upper end to the lower end as viewed from above.

An electronic component mounting board according to another aspect of the present invention includes a substrate including a mount area in which an electronic component is mountable, and electrode pads located at ends of the mount area as viewed from above. The substrate includes at least one side surface that slopes from an upper end to a lower end of the substrate outside the electrode pads and flares from the upper end to the lower end as viewed from above.

An electronic device according to one aspect of the present invention includes the electronic component mounting board, an electronic component mounted in the mount area, and a lid located on an upper end of a frame and covering the electronic component.

An electronic module according to one aspect of the present invention includes the electronic device and a housing located on an upper surface of the electronic device.

DETAILED DESCRIPTION

Figure 1A:
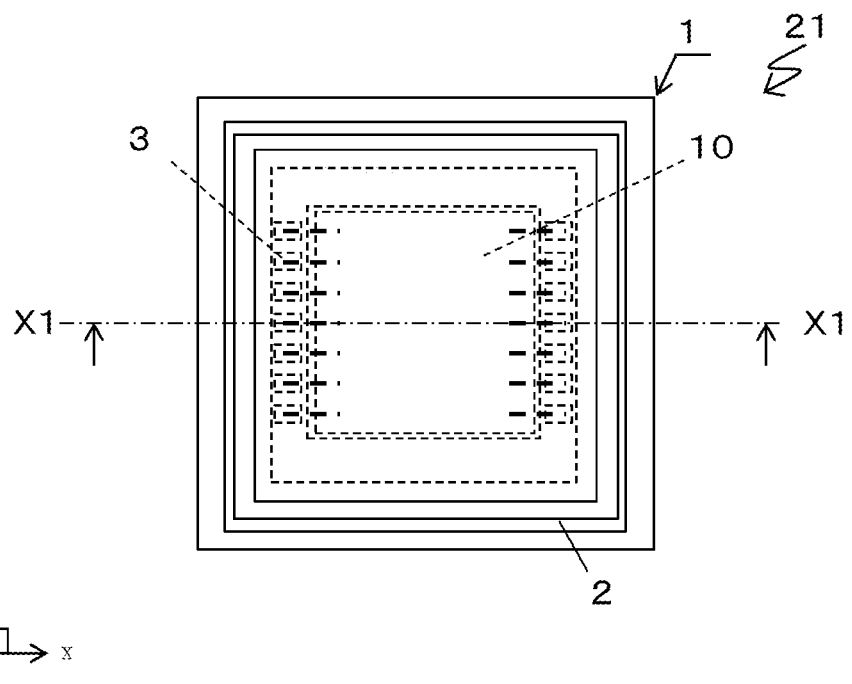
FIG. 1A is an external top view of an electronic component mounting board and an electronic device according to a first embodiment of the present invention.

Structures of Electronic Component Mounting Board and Electronic Device

Embodiments of the present invention will now be described by way of example with reference to the drawings. In the embodiments described below, an electronic device includes an electronic component mounted on an electronic component mounting board with a lid bonded to the upper surface of the electronic component mounting board. An electronic module includes a housing or a member covering the upper or lower surface of the electronic component mounting board or the electronic device. Although the electronic component mounting board, the electronic device, and the electronic module may be arranged to have any of their faces being upward or downward, they are herein defined using the orthogonal xyz coordinate system with the positive z direction being upward for ease of explanation.

First Embodiment

An electronic device 21 and an electronic component mounting board 1 according to a first embodiment of the present invention will now be described with reference to FIGS. 1A to 3B. The electronic device 21 according to the present embodiment includes the electronic component mounting board 1 and an electronic component 10. FIGS. 1A to 3B show the electronic device 21. FIGS. 3A and 3B show an electronic module.

The electronic component mounting board 1 includes a substrate 2a having an upper surface including a mount area 4, in which the electronic component 10 is mountable. The substrate 2a includes electrode pads 3, which are located at the ends of the mount area 4 as viewed from above. The electronic component mounting board 1 includes a frame 2b located outside the electrode pads 3 on the upper surface of the substrate 2a. The frame 2b has side surfaces that slope from the upper end to the lower end of the frame 2b and flare from the upper end to the lower end as viewed from above.

The electronic component mounting board 1 includes a substrate 2a having an upper surface including a mount area 4, in which the electronic component 10 is mountable. The substrate 2a includes electrode pads 3, which are located at the ends of the mount area 4 as viewed from above. The electronic component mounting board 1 includes a frame 2b located outside the electrode pads 3 on the upper surface of the substrate 2a. The structure including the frame 2b and the substrate 2a, the structure simply including the frame 2b, and the structure simply including the substrate 2a are herein collectively referred to as the base 2.

The mount area 4 may be located around the center of the base 2 or may deviate from the center of the base 2. The mount area 4 at least partially overlaps the electronic component 10 as viewed from above, and may either extend over or be within the outer edge of the electronic component 10.

The substrate 2a and the frame 2b in the electronic component mounting board 1 may each be a laminate of a plurality of insulating layers or may each be formed as one piece. The insulating layers to be the substrate 2a and the frame 2b are formed from, for example, an electrical insulating ceramic material or a resin (e.g., plastics or a thermoplastic resin). The substrate 2a may be formed from a metal material.

Examples of the electrical insulating ceramic material used for the insulating layers forming the substrate 2a and the frame 2b include sintered aluminum oxide, sintered mullite, sintered silicon carbide, sintered aluminum nitride, sintered silicon nitride, and sintered glass ceramic. Examples of the resin used for the insulating layers forming the substrate 2a and the frame 2b include a thermoplastic resin, an epoxy resin, a polyimide resin, an acryl resin, a phenolic resin, and a fluorine-based resin. Examples of the fluorine-based resin include a polyester resin and a polytetrafluoroethylene resin.

Figure 1B:
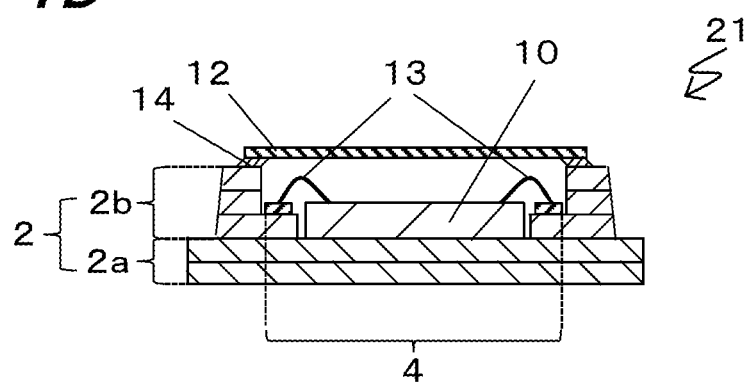
FIG. 1B is a cross-sectional view taken along line X1-X1 in FIG. 1A.

The insulating layers forming the substrate 2a and the frame 2b may be a plurality of insulating layers formed from the above material that are stacked on one another. The insulating layers forming the substrate 2a or the frame 2b may be two or three insulating layers as shown in FIG. 1B, or may be four or more insulating layers. The use of two or three layers reduces the thickness of the electronic component mounting board 1. The use of six or more layers increases the rigidity of the electronic component mounting board 1. As in the examples shown in FIGS. 1A to 2B, the frame 2b may have an opening with a step that is defined by a frame with a different size, on which the electrode pads 3 (described later) may be placed.

The substrate 2a and the frame 2b may be formed from the same material, may contain the same material, or may be formed from different materials. For example, the substrate 2a and the frame 2b formed from different materials may be bonded together using a bond or another member.

The base 2 has an outermost perimeter with a length of, for example, 0.3 mm to 10 cm on one side, and may be rectangular or square as viewed from above. The base 2 has a thickness of, for example, at least 0.2 mm.

The electronic component mounting board 1 includes the electrode pads 3, which are located at the ends of the mount area 4. The electrode pads 3 overlap the ends of the mount area 4 as viewed from above, and may be arranged on either the substrate 2a or the frame 2b included in the base 2, or may be arranged over both the substrate 2a and the frame 2b. The ends of the mount area 4 herein refer to any points other than the center of the mount area 4. Each electrode pad 3 defines an area in which one electrode pad 3 is bonded with a device bond 13 for bonding the electrode pad 3 and the electronic component 10, and may contain a conducting wire that extends inside or outside the area.

The base 2 may include electrodes for connection to external circuits on its upper surface, side surfaces, or lower surface. The electrodes for connection to external circuits electrically connect the substrate 2a and the frame 2b to an external circuit board, or the electronic device 21 to an external circuit board.

The base 2 may contain, in addition to the electrode pads 3, inner wires between the insulating layers and feedthrough conductors that vertically connect the inner wires. The inner wires or the feedthrough conductors may be uncovered on the surface of the base 2. The inner wires or the feedthrough conductors may electrically connect the electrode pads 3 to the electrodes for connection to external circuits.

When the base 2 is formed from an electrical insulating ceramic material, the electrode pads 3, the electrodes for connection to external circuits, the inner wires, and the feedthrough conductors include tungsten (W), molybdenum (Mo), manganese (Mn), silver (Ag), or copper (Cu), or an alloy containing one or more of these metals. When the base 2 is formed from a resin, the electrode pads 3, the electrodes for connection to external circuits, the inner wires, and the feedthrough conductors are formed from copper (Cu), gold, (Au), aluminum (Al), nickel, (Ni), molybdenum (Mo), or titanium (Ti), or an alloy containing one or more of these metals. When the substrate 2a and the frame 2b included in the base 2 are formed from different materials, the electrode pads 3, the electrodes for connection to external circuits, the inner wires, and the feedthrough conductors may each be formed from a material selected from the above listed materials in accordance with the material for the base 2 and the frame material.

The uncovered surfaces of the electrode pads 3, the electrodes for connection to external circuits, the inner wires, and the feedthrough conductors may be plated. The plating layer protects the surfaces of the electrode pads 3, the electrodes for connection to external circuits, the inner wires, and the feedthrough conductors against oxidation.

The electronic component mounting board 1 according to the embodiments of the present invention with the above structure reduces shadows produced along the perimeter of the electronic component mounting board 1. The electronic component mounting board 1 has sloping side surfaces to reduce wall portions that may block falling light during inspection. More specifically, the sloping side surfaces reduce shadows produced by light blocked along the profile of the electronic component mounting board 1 outside the outer edge of the electronic component mounting board 1 as viewed from above. This prevents the shadow line of the frame 2b from being misrecognized as the profile line in, for example, image recognition for transporting the frame 2b or in recognition of the outer edge of the frame 2b for mounting the electronic component 10, and reduces mounting failures.

As shown in FIGS. 1A to 3B, the electronic component mounting board 1 may include the substrate 2a with its outer edge protruding outward from the outer edge of the frame 2b as viewed from above. The substrate 2a with its outer edge protruding outward from the outer edge of the frame 2b allows electronic components to be mounted on or external circuit boards connected to the upper surface of its protruding portion. This increases the functionality of the electronic device 21. In this structure, the frame 2b has side surfaces that slope from the upper end to the lower end of the frame 2b. The sloping side surfaces prevent the shadow line of the frame 2b from being misrecognized as the profile line in image recognition for transporting the frame 2b to the substrate 2a. This structure reduces mounting failures.

Figure 2A:
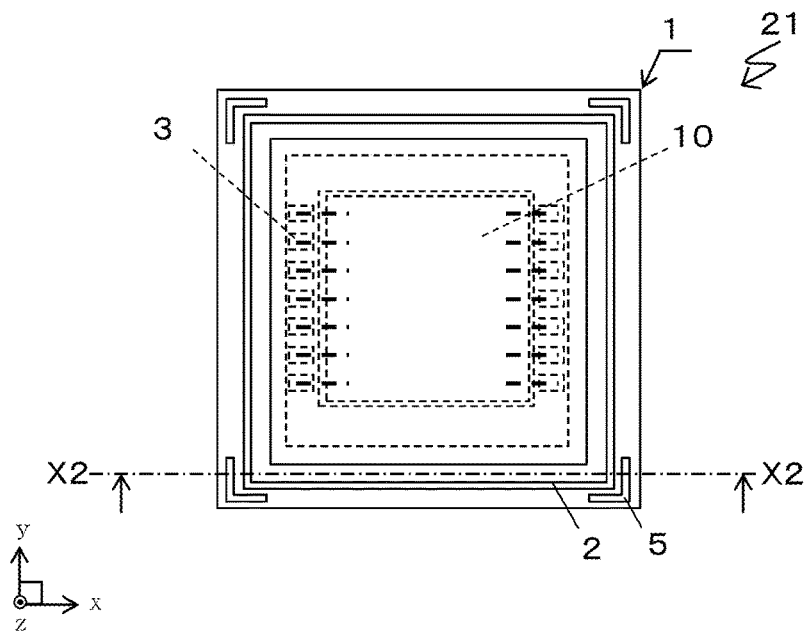
FIG. 2A is an external top view of an electronic component mounting board and an electronic device according to a modification of the first embodiment of the present invention.
Figure 2B:
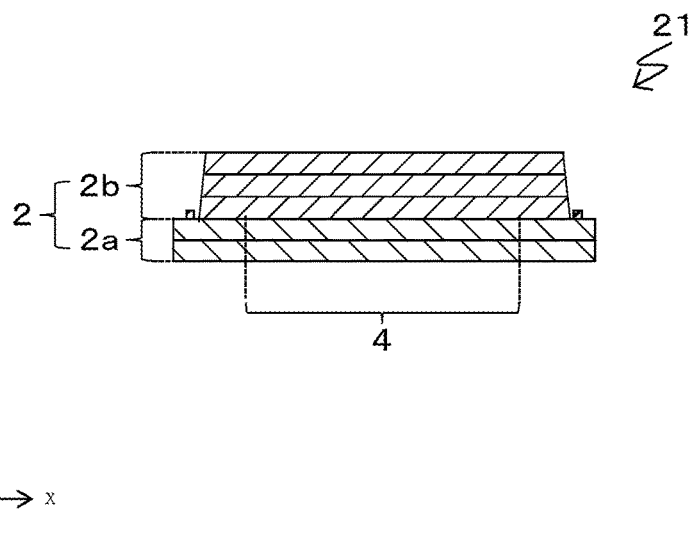
FIG. 2B is a cross-sectional view taken along line X2-X2 in FIG. 2A.
Figure 3A:
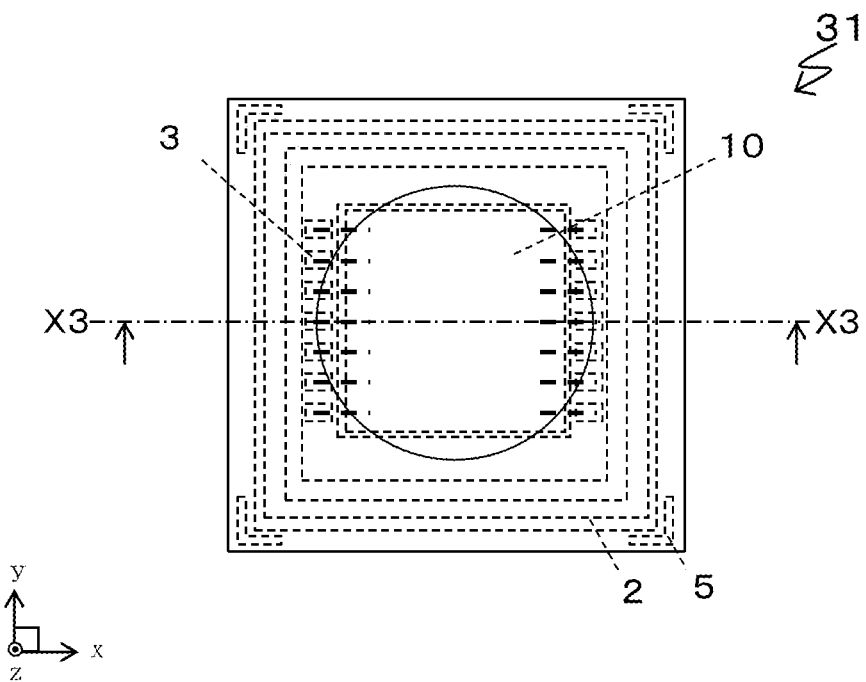
FIG. 3A is an external top view of an electronic component mounting board, an electronic device, and an electronic module according to a modification of the first embodiment of the present invention.
Figure 3B:
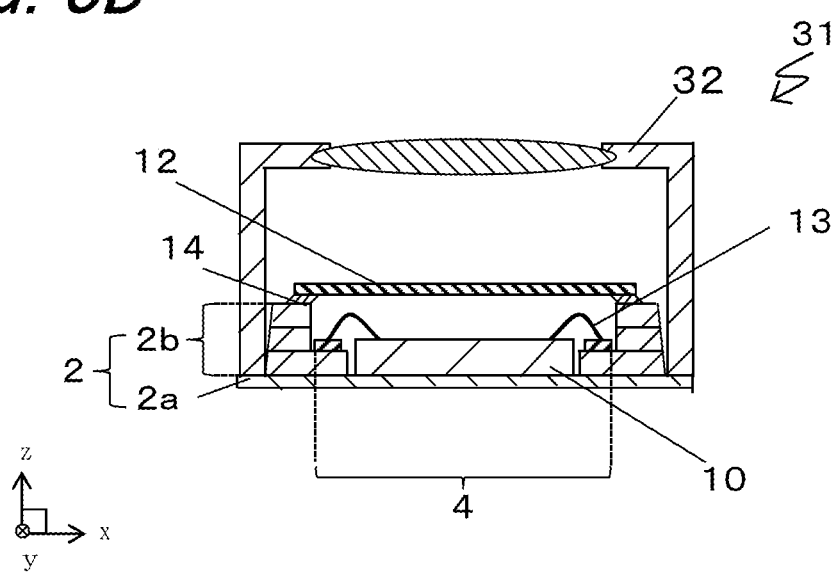
FIG. 3B is a cross-sectional view taken along line X3-X3 in FIG. 3A.

As in the examples shown in FIGS. 2A and 3A, the protruding portion of the substrate 2a may have alignment patterns 5 on its upper surface. This further simplifies the mounting of the frame 2b, and allows detection of the frame 2b rotated or misaligned in mounting.

The substrate 2a may include a plurality of insulating layers as in the examples shown in FIGS. 1A to 2B. The substrate 2a may include a single insulating layer or may be a flat plate formed from a metal material as in the example shown in FIGS. 3A and 3B.

The substrate 2a including a plurality of insulating layers may contain wiring conductors to form inner circuits. This improves the electrical characteristics of the electronic device 21. The substrate 2a including a plurality of insulating layers improves the strength of the substrate 2a.

As in FIGS. 3A and 3B, the substrate 2a including a single insulating layer or being a flat metal plate reduces the thickness of the electronic device 21. The substrate 2a being a flat metal plate improves heat dissipation from the electronic device 21. This structure reduces the likelihood that heat generated from the electronic device 21 when mounted can cause malfunctions.

The alignment patterns 5 may be formed from the same material as or a material different from the material for the electrode pads 3. The surfaces of the alignment patterns 5 may or may not be plated. When, for example, the substrate 2a is a flat metal plate, the alignment patterns 5 may be cut-away parts of the substrate 2a.

Examples of the metal material for the substrate 2a include stainless steel (SUS), an Fe—Ni—Co alloy, alloy 42, copper (Cu), and a copper alloy. When, for example, the frame 2b is formed from sintered aluminum oxide with a coefficient of thermal expansion of about $5 \times 10^{-6}/°$ C. to $10 \times 10^{-6}/°$ C., the substrate 2a may be formed from stainless steel (SUS 410 or SUS 304) with a coefficient of thermal expansion of about $10 \times 10^{-6}/°$ C. to $17 \times 10^{-6}/°$ C.

In this case, the frame 2b has a small difference in thermal contraction and expansion from the substrate 2a. This reduces stress applied between the frame 2b and the substrate 2a, and reduces deformation of the frame 2b or the substrate 2a, and thus reduces cracks or breaks in the frame 2b.

When the substrate 2a and the frame 2b included in the base 2 are formed from the same material, the frame 2b and the substrate 2a may be formed integrally. In this structure, the frame 2b and the substrate 2a are firmly connected to each other. The substrate 2a and the frame 2b are less likely to be separate or be misaligned due to, for example, thermal hysteresis during mounting of the electronic component 10.

The lower surface and the side surfaces (slopes) of the base 2 form an angle θ with which less shadows are produced along the perimeter from the position of the light source used in each process. For example, the angle θ may be $45° \leq θ < 90°$. At the angle θ of 45° or greater, the lower surface and the side surfaces (slopes) of the base 2 form less breakable edges, thus reducing chips. At the angle θ of less than 90°, the structure further reduces chips, and also more effectively reduces shadows produced along the perimeter.

Electronic Device Structure

FIGS. 1A to 2B show an example of the electronic device 21. The electronic device 21 includes the electronic component mounting board 1, the electronic component 10 mounted in the mount area 4 on the electronic component mounting board 1, and a lid 12 located to cover the electronic component 10.

The electronic device 21 includes the electronic component mounting board 1 and the electronic component 10 mounted in the mount area 4 on the electronic component mounting board 1. The electronic component 10 is, for example, an imaging device such as a charge-coupled device (CCD) or a complementary metal oxide semiconductor (CMOS) device, a light-emitting device such as a light emitting diode (LED), or an integrated circuit such as a large-scale integrated circuit (LSI). The electronic component 10 may be mounted on the upper surface of the base 2 (substrate 2a) with an adhesive. The adhesive is, for example, silver epoxy or a thermosetting resin.

The electronic device 21 may include the lid 12 that covers the electronic component 10 and is located on the upper surface of the electronic component mounting board 1. In this structure, the electronic component mounting board 1 may have the lid 12 bonded to the upper surface of the frame 2b, or include a frame member that supports the lid 12 and surrounds the electronic component 10 on the upper surface of the frame 2b. The frame member may be formed from the same material as or a material different from the material for the frame 2b.

When the frame member and the frame 2b are formed from the same material, they may be formed integrally with the uppermost insulating layer, with the frame member and the frame 2b having an opening, or may be bonded together with a separate brazing material.

When the frame member and the frame 2b are formed from different materials, the frame member may be formed from, for example, the same material as the material for a lid bond 14 for bonding the lid 12 to the frame 2b. In this case, the lid bond 14 is thick to function both as a bonding member and a frame member (as a support for the lid 12). Examples of the lid bond 14 include a thermosetting resin and a brazing material formed from glass with a low melting point or a metal component. The frame member and the lid 12 may be formed from the same material. In this case, the frame member and the lid 12 may be formed as one piece.

The lid 12 is a highly transparent member formed from, for example, a glass material, when the electronic component 10 is an imaging device such as a CMOS and a CCD, or a light-emitting device such as an LED. The lid 12 may be formed from a metallic material or an organic material when the electronic component 10 is an integrated circuit.

The lid 12 is bonded to the electronic component mounting board 1 with the lid bond 14. Examples of the material for the lid bond 14 include a thermosetting resin and a brazing material formed from glass with a low melting point or a metal component.

The electronic device 21 includes the electronic component mounting board 1 shown in FIGS. 1A to 3B to improve the mountability of the electronic component 10.

Electronic Module Structure

FIGS. 3A and 3B show an example of an electronic module 31 including the electronic component mounting board 1. The electronic module 31 includes the electronic device 21 and a housing 32 located on the upper surface of the electronic device 21 or covering the electronic device 21.

In the example described below, the electronic module 31 is, for example, an imaging module.

The electronic module 31 includes the housing 32 (lens holder). The housing 32 improves hermetical sealing and prevents the electronic device 21 from directly receiving external stress. The housing 32 is formed from, for example, a resin or metal material. The lens holder as the housing 32 may incorporate one or more lenses formed from, for example, a resin, a liquid, glass, or quartz. The housing 32 may include, for example, a drive for vertical or horizontal driving, and may be electrically connected to the electronic component mounting board 1.

The housing 32 may have an opening in at least one of the four sides as viewed from above. Through the opening in the housing 32, an external circuit board may be placed for electrical connection to the electronic component mounting board 1. After the external circuit board is electrically connected to the electronic component mounting board 1, the opening in the housing 32 may be sealed with a sealant, such as a resin, to hermetically seal the inside of the electronic module 31.

Method for Manufacturing Electronic Component Mounting Board and Electronic Device An example method for manufacturing the electronic component mounting board 1 and the electronic device 21 according to the present embodiment will now be described. The manufacturing method described below uses a multi-piece wiring substrate to fabricate the substrates 2a and the frames 2b.

(1) A ceramic green sheet that is to be the substrate 2a and the frame 2b is prepared first. To obtain, for example, the substrate 2a and the frame 2b formed from sintered aluminum oxide ($Al_2O_3$), powders, such as silica ($SiO_2$), magnesia (MgO), or calcium oxide (CaO), are added as a sintering aid to $Al_2O_3$ powder, and an appropriate binder, an appropriate solvent, and an appropriate plasticizer are added to the powder mixture, which is then kneaded to form slurry. The slurry is then shaped into a sheet using a doctor blade or by calendaring to obtain a ceramic green sheet for a multi-piece substrate.

The substrate 2a and the frame 2b formed from, for example, a resin may be molded using a mold having a predetermined shape by transfer molding or injection molding. The substrate 2a and the frame 2b may be formed from a glass epoxy resin, which is a base glass fiber impregnated with a resin. In this case, the base glass fiber is impregnated with a precursor of an epoxy resin. The epoxy resin precursor is then cured by heat at a predetermined temperature to form the substrate 2a and the frame 2b.

The substrate 2a as a flat metal plate may be formed by, for example, punching a predetermined metal material using a stamping mold or etching a predetermined metal material. The substrate 2a and the frame 2b formed from different materials may be formed with the methods described above.

(2) A metal paste is then applied or placed, by screen printing or other techniques, into the areas to be the electrode pads 3, the electrodes for connection to external circuits, the inner wires, and the feedthrough conductors in the ceramic green sheet obtained through the above process (1). The metal paste is prepared by adding an appropriate solvent and an appropriate binder to the metal powder containing the above metal materials and then kneading the mixture to have an appropriate viscosity. The metal paste may contain glass or ceramic to increase the strength of bonding with the substrate 2a and the frame 2b. The metal paste may also be applied into predetermined areas on the surface of the substrate 2a to form the alignment patterns 5.

(3) The above green sheet is then processed using, for example, a mold. This process may include forming an opening in the center of the green sheet to be the frame 2b.

(4) The ceramic green sheets to be the insulating layers are then stacked and pressed to prepare a ceramic green sheet laminate to be the base 2 (or the electronic component mounting board 1) including the stacked substrate 2a and frame 2b. This process also includes pressing the areas to be the side surfaces with a mold, thus forming the side surfaces that slope from the upper end to the lower end and flare from the upper end to the lower end as viewed from above.

(5) This ceramic green sheet laminate is then fired at about 1,500 to 1,800° C. to obtain a multi-piece wiring substrate including an array of substrates 2a and frames 2b, or an array of bases 2 (electronic component mounting boards 1). In this process, the metal paste described above is fired together with the ceramic green sheet to be the substrate 2a and the frame 2b, or the base 2 (electronic component mounting board 1) to form the electrode pads 3, the electrodes for connection to external circuits, the inner wires, and the feedthrough conductors.

(6) The multi-piece wiring substrate resulting from the firing process is then cut into a plurality of substrates 2a and frames 2b, or a plurality of bases 2 (electronic component mounting boards 1). In this cutting process, separation grooves may be formed along the outer edge of each of the substrates 2a and the frames 2b, or the bases 2 (electronic component mounting boards 1), and the multi-piece wiring substrate may be split along the separation grooves into the plurality of substrates 2a and frames 2b, or the plurality of bases 2 (electronic component mounting boards 1). In other embodiments, the multi-piece wiring substrate may be cut along the outer edge of each of the substrates 2a and the frames 2b, or the bases 2 (electronic component mounting boards 1) by, for example, slicing. The separation grooves may be formed to have a depth smaller than the thickness of the multi-piece wiring substrate using a slicer after the firing process. In still other embodiments, the separation grooves may be formed by pressing a cutter blade onto the ceramic green sheet laminate that is to be the multi-piece wiring substrate or by cutting the ceramic green sheet laminate to a depth smaller than its thickness with a slicer.

The process of pressing the cutter blade onto the ceramic green sheet laminate may use the cutter blade with a sharp cutting edge to form the side surfaces that slope from the upper end to the lower end and flare from the upper end to the lower end as viewed from above. In another embodiment, the side surfaces of the substrate 2a and the frame 2b, which are split into pieces, may be ground to slope from the upper end to the lower end and flare from the upper end to the lower end as viewed from above, thus forming the side surfaces that slope from the upper end to the lower end and flare from the upper end to the lower end as viewed from above. The substrate 2a and the frame 2b split into pieces are then bonded together to form the electronic component mounting board 1.

(7) The electronic component 10 is then mounted on the electronic component mounting board 1. The electronic component 10 is electrically connected to the electronic component mounting board 1 by, for example, wire bonding. The electronic component 10 may be fixed onto the electronic component mounting board 1 with an adhesive or another bond applied to the electronic component 10 or to the electronic component mounting board 1. After the electronic component 10 is mounted on the electronic component mounting board 1, the lid 12 may be bonded to the electronic component mounting board 1 with the lid bond 14.

The electronic device 21 is obtained by assembling the electronic component mounting board 1 and mounting the electronic component 10 on the electronic component mounting board 1 through the processes (1) to (7). The processes (1) to (7) may be performed in any order.

Second Embodiment

An electronic component mounting board 1 according to a second embodiment of the present invention will now be described with reference to FIGS. 4A and 4B. The electronic component mounting board 1 according to the present embodiment differs from the electronic component mounting board 1 according to the first embodiment in that the side surfaces of the substrate 2a slope from the upper end to the lower end.

Figure 4A:
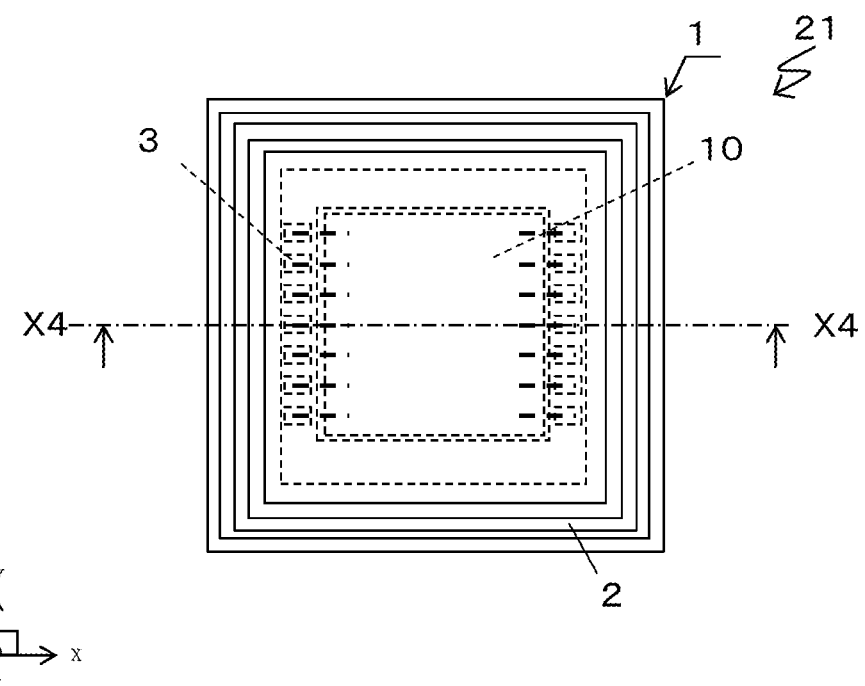
FIG. 4A is an external top view of an electronic component mounting board and an electronic device according to a second embodiment of the present invention.
Figure 4B:
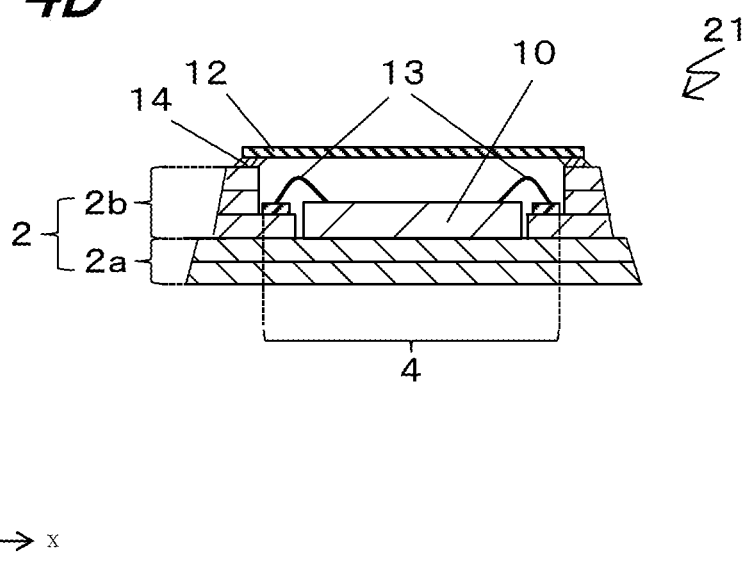
FIG. 4B is a cross-sectional view taken along line X4-X4 in FIG. 4A.

In FIGS. 4A and 4B, the side surfaces of the substrate 2a slope from the upper end to the lower end of the substrate 2a and flare from the upper end to the lower end as viewed from above. This structure prevents the shadow line of the substrate 2a from being misrecognized as the profile line in image recognition for connecting the base 2, including the substrate 2a and the frame 2b bonded together to an external circuit board or for mounting the electronic component 10 using the outer sides of the substrate 2a as its reference. This structure reduces mounting failures.

The side surfaces of the substrate 2a and the side surfaces of the frame 2b may slope at the same angle or at different angles. When the substrate 2a and the frame 2b have the same slope angle, the slopes may be formed using the same tool. When the substrate 2a and the frame 2b have different slope angles, the angles may be optimized to reduce shadows produced by light from different imaging devices for the substrate 2a (e.g., an imaging device for mounting the substrate 2a on an external circuit board) and for the frame 2b (e.g., an imaging device for mounting the frame 2b on the substrate 2a).

The side surfaces of the substrate 2a that slope from the upper end to the lower end and flare from the upper end to the lower end as viewed from above are formed in the same manner as the side surfaces of the frame 2b described in the first embodiment.

Although the substrate 2a includes a plurality of layers in FIGS. 4A and 4B, the substrate 2a may be a flat metal plate. The flat metal plate as the substrate 2a may be heated and pressed into a mold to have sloping side surfaces.

Third Embodiment

An electronic component mounting board 1 according to a third embodiment of the present invention will now be described with reference to FIGS. 5A and 5B. The electronic component mounting board 1 according to the present embodiment differs from the electronic component mounting board 1 according to the second embodiment in that the side surfaces of the substrate 2a and the side surfaces of the frame 2b slope continuously.

Figure 5A:
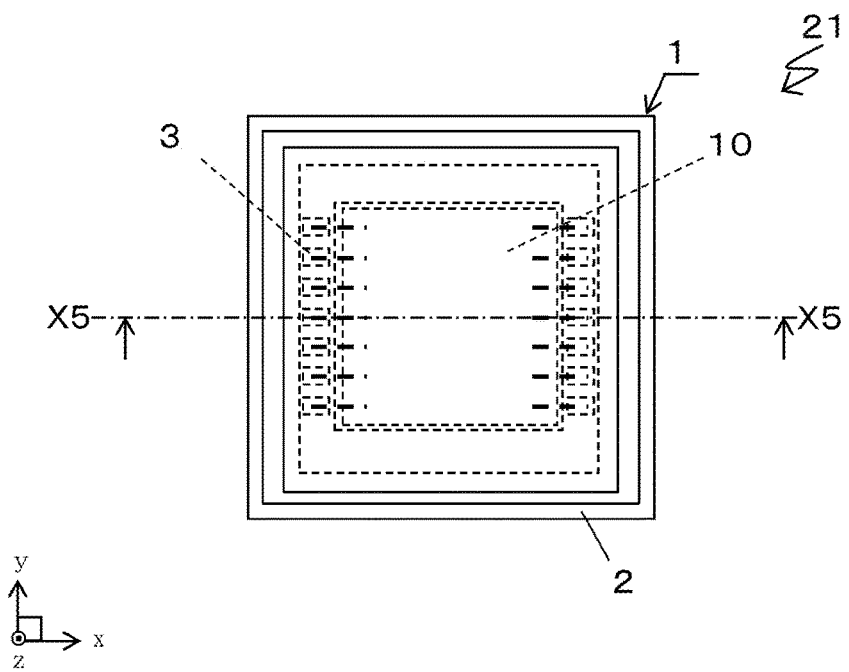
FIG. 5A is an external top view of an electronic component mounting board and an electronic device according to a third embodiment of the present invention.
Figure 5B:
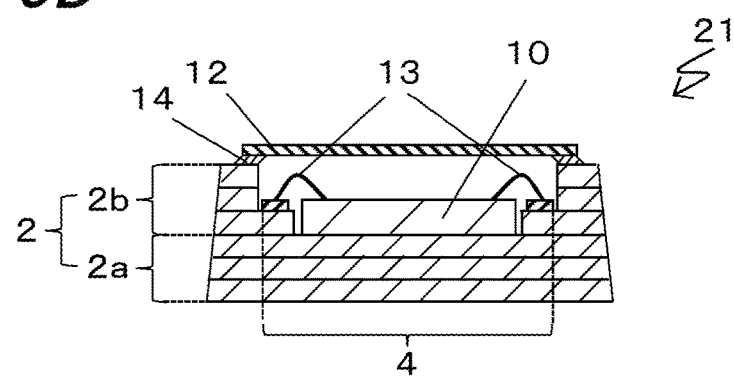
FIG. 5B is a cross-sectional view taken along line X5-X5 in FIG. 5A.

In FIGS. 5A and 5B, the side surfaces of the substrate 2a slope from the upper end to the lower end of the substrate 2a and flare from the upper end to the lower end as viewed from above. The side surfaces of the substrate 2a and the side surfaces of the frame 2b continuously slope from the upper end of the frame 2b to the lower end of the substrate 2a. This structure prevents the shadow of the base 2 from being misrecognized as the profile line in image recognition for connecting the base 2 to an external circuit board or for mounting the electronic component 10 using the outer sides of the base 2 as its reference. This structure reduces mounting failures.

In FIGS. 5A and 5B, the frame 2b and substrate 2a may be first integrated, and the side surfaces may be processed to have slopes. This improves the bonding strength between the frame 2b and the substrate 2a, and uses a single process to form the slopes on the side surfaces to allow easy fabrication of the electronic component mounting board 1 having the slopes.

The side surfaces of the substrate 2a and the frame 2b that continuously slope from the upper end of the frame 2b to the lower end of the substrate 2a may be formed with the manufacturing method described in the first embodiment. For example, the base 2 formed from an electrical insulating ceramic material may be formed by first pressing and stacking the frame 2b and the substrate 2a into a ceramic laminate to be the base 2, and then processing the ceramic laminate using the same process as for the frame 2b.

Fourth Embodiment

Figure 6A:
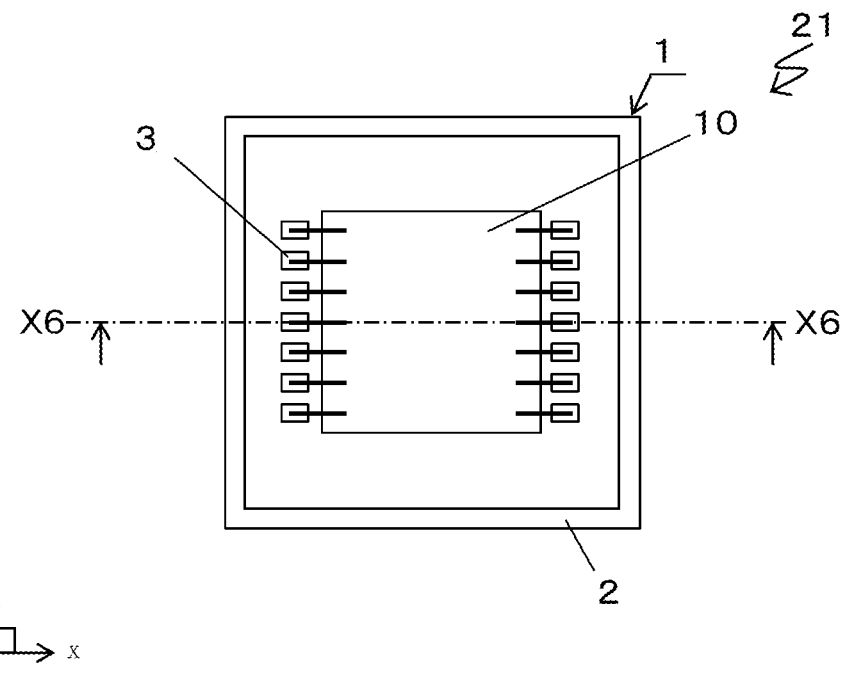
FIG. 6A is an external top view of an electronic component mounting board and an electronic device according to a fourth embodiment of the present invention.
Figure 6B:
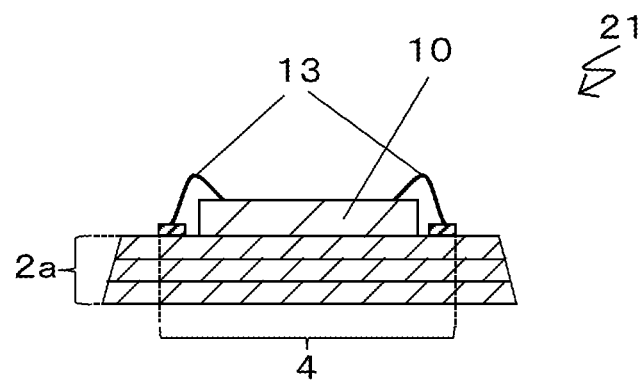
FIG. 6B is a cross-sectional view taken along line X6-X6 in FIG. 6A.

An electronic device 21 and an electronic component mounting board 1 according to a fourth embodiment of the present invention will now be described with reference to FIGS. 6A and 6B. The electronic device 21 according to the present embodiment includes the electronic component mounting board 1 and an electronic component 10. FIGS. 6A and 6B show the electronic device 21 in the present embodiment.

The electronic component mounting board 1 includes a substrate 2a having a mount area 4 in which the electronic component 10 is mountable. The substrate 2a includes electrode pads 3, which are located at the ends of the mount area 4 as viewed from above. The side surfaces of the substrate 2a slope from the upper end of the substrate 2a to the lower end of the substrate 2a outside the electrode pads 3 and flare from the upper end to the lower end as viewed from above.

The structure of the electronic device 21, the basic structures of the substrate 2a, the electrode pads 3, and the mount area 4 included in the electronic component mounting board 1, and other basic conditions, structures, and materials in the present embodiment are similar to or the same as those described in the first embodiment, and will not be described. In the fourth embodiment below, the features in the embodiment and components different from those in the first embodiment will be described.

The electronic component mounting board 1 includes the substrate 2a having the mount area 4 in which the electronic component 10 is mountable.

The mount area 4 may be located around the center of the substrate 2a or may deviate from the center of the substrate 2a. The mount area 4 at least partially overlaps the electronic component 10 as viewed from above, and may be larger than the area defined by the outer edge of the electronic component 10 or smaller than the area defined by the outer edge of the electronic component 10 as in the example shown in FIGS. 7A and 7B described later. The upper surface or the lower surface of the substrate 2a may include the mount area 4 as in the example shown in FIGS. 7A and 7B described later. The electrode pads 3 overlap the ends of the mount area 4 as viewed from above. For example, when the lower surface of the substrate 2a includes the mount area 4, the electrode pads 3 are located at least on either the upper surface or the lower surface of the substrate 2*a*.

Although the substrate 2*a* shown in FIGS. 6A and 6B is a flat plate, the substrate 2*a* may have a through-hole in a part of the mount area 4 as in the example shown in FIGS. 7A and 7B described later. The through-hole in the substrate 2*a* may contain the electronic component 10. The side surfaces of the substrate 2*a* in the electronic component mounting board 1 slope from the upper end of the substrate 2*a* to the lower end of the substrate 2*a* outside the electrode pads 3 and flare from the upper end to the lower end as viewed from above.

The electronic component mounting board 1 according to the present embodiment with the above structure reduces shadows produced along the perimeter of the electronic component mounting board 1. This structure prevents the shadow line of the substrate 2*a* from being misrecognized as the profile line in image recognition for transporting the substrate 2*a* or in recognition of the outer edge of the substrate 2*a* for mounting the electronic component 10. This structure reduces mounting failures.

Electronic Device Structure

FIGS. 6A and 6B show an example of the electronic device 21. In FIGS. 6A and 6B, the lid 12 is not shown. The electronic device 21 includes the electronic component mounting board 1, the electronic component 10 mounted in the mount area 4 on the electronic component mounting board 1, and the lid 12 covering the electronic component 10. The structure, conditions, and materials of the electronic device 21 are the same as those described in the first embodiment, and will not be described.

The electronic device 21 may include a frame member that supports the lid 12 and surrounds the electronic component 10 on the upper surface of the substrate 2*a*. The frame member may be formed from the same material as or a material different from the material for the substrate 2*a*. Similarly to the substrate 2*a*, the frame member may have side surfaces that slope from the upper end to the lower end and flare from the upper end to the lower end as viewed from above.

When the frame member and the substrate 2*a* are formed from the same material, they may be formed integrally with the uppermost insulating layer, with the frame member and the substrate 2*a* having an opening, or may be bonded together with a separate brazing material.

When the frame member and the substrate 2*a* are formed from different materials, the frame member may be formed from, for example, the same material as the material for a lid bond 14 bonding the lid 12 to the substrate 2*a*. In this case, the lid bond 14 is thick to function both as a bonding member and a frame member (as a support for the lid 12). Examples of the lid bond 14 in this case include a thermosetting resin, and a brazing material formed from glass with a low melting point or a metal component. The frame member and the lid 12 may be formed from the same material. In this case, the frame member and the lid 12 may be formed as one piece.

The electronic device 21 includes the electronic component mounting board 1 shown in FIGS. 6A and 6B to improve the mountability of the electronic component 10.

Electronic Module Structure

An example of an electronic module 31 including the electronic component mounting board 1 will now be described. The electronic module 31 includes the electronic device 21 and a housing 32 located on the upper surface of the electronic device 21 or covering the electronic device 21. The structure, conditions, and material of the electronic module 31 are the same as those described in the first embodiment, and will not be described.

Method for Manufacturing Electronic Component Mounting Board and Electronic Device An example method for manufacturing the electronic component mounting board 1 and the electronic device 21 according to the present embodiment will now be described. The manufacturing method described below uses a multi-piece wiring substrate including a plurality of substrates 2*a*.

(1) A ceramic green sheet that is to be the substrate 2*a* is prepared first. To obtain, for example, the substrate 2*a* formed from sintered aluminum oxide ($Al_2O_3$), powders, such as silica ($SiO_2$), magnesia (MgO), or calcium oxide (CaO), are added as a sintering aid to $Al_2O_3$ powder, and an appropriate binder, an appropriate solvent, and an appropriate plasticizer are added to the powder mixture, which is then kneaded to form slurry. The slurry is then shaped into a sheet using a doctor blade or by calendaring to obtain a ceramic green sheet for a multi-piece substrate.

The substrate 2*a* formed from, for example, a resin may be molded using a mold having a predetermined shape by transfer molding or injection molding. The substrate 2*a* may be formed from a glass epoxy resin, which is a base glass fiber impregnated with a resin. In this case, the base glass fiber is impregnated with a precursor of an epoxy resin. The epoxy resin precursor is then cured by heat at a predetermined temperature to form the substrate 2*a*.

(2) A metal paste is then applied or placed, by screen printing or other techniques, into the areas to be the electrode pads 3, the electrodes for connection to external circuits, the inner wires, and the feedthrough conductors in the ceramic green sheet obtained through the above process (1). The metal paste is prepared by adding an appropriate solvent and an appropriate binder to the metal powder containing the above metal materials and then kneading the mixture to have an appropriate viscosity. The metal paste may contain glass or ceramic to increase the strength of bonding with the substrate 2*a*.

(3) The above green sheet is then processed using, for example, a mold. This process may include forming a through-hole in the center of the green sheet to be the substrate 2*a* as in the example shown in FIGS. 7A and 7B described later.

(4) The ceramic green sheets to be the insulating layers are then stacked and pressed.

This process also includes pressing the areas to be side surfaces with a mold, thus forming the side surfaces that slope from the upper end to the lower end and flare from the upper end to the lower end as viewed from above.

(5) This ceramic green sheet laminate is then fired at about 1,500 to 1,800° C. to obtain a multi-piece wiring substrate including an array of substrates 2*a*. In this process, the metal paste described above is fired together with the ceramic green sheet to be the substrate 2*a* to form the electrode pads 3, the electrodes for connection to external circuits, the inner wires, and the feedthrough conductors.

(6) The multi-piece wiring substrate resulting from the firing process is then cut into a plurality of substrates 2*a*. In this cutting process, separation grooves may be formed along the outer edge of each substrate 2*a*, and the multi-piece wiring substrate may be split along the separation grooves into the plurality of substrates 2*a*. In other embodiments, the multi-piece wiring substrate may be cut along the outer edge of each substrate 2*a* by, for example, slicing. The separation grooves may be formed to have a depth smaller than the thickness of the multi-piece wiring substrate using a slicer after the firing process. In still other embodiments, the separation grooves may be formed by pressing a cutter blade onto the ceramic green sheet laminate that is to be the multi-piece wiring substrate or by cutting the ceramic green sheet laminate to a depth smaller than its thickness with a slicer.

The processing of pressing the cutter blade onto the ceramic green sheet laminate may use the cutter blade with a sharp cutting edge to form the side surfaces that slope from the upper end to the lower end and flare from the upper end to the lower end as viewed from above.

In another embodiment, the side surfaces of the substrate 2a, which are obtained by splitting the multi-piece wiring substrate into multiple pieces, may be ground to slope from the upper end to the lower end and flare from the upper end to the lower end as viewed from above to form the side surfaces that slope from the upper end to the lower end and flare from the upper end to the lower end as viewed from above.

(7) The electronic component 10 is then mounted on the electronic component mounting board 1. The electronic component 10 is electrically connected to the electronic component mounting board 1 by, for example, wire bonding. The electronic component 10 may be fixed onto the electronic component mounting board 1 with an adhesive or another bond applied to the electronic component 10 or to the electronic component mounting board 1. After the electronic component 10 is mounted on the electronic component mounting board 1, the lid 12 may be bonded to the electronic component mounting board 1 with the lid bond 14.

The electronic device 21 is obtained by forming the electronic component mounting board 1 and mounting the electronic component 10 on the electronic component mounting board 1 through the processes (1) to (7). The processes (1) to (7) may be performed in any order.

Fifth Embodiment

An electronic component mounting board 1 according to a fifth embodiment will now be described with reference to FIGS. 7A and 7B. The electronic component mounting board 1 according to the present embodiment differs from the electronic component mounting board 1 according to the fourth embodiment in that the mount area 4 and the electrode pads 3 are located on the lower surface of the substrate 2a, and that the substrate 2a has a through-hole at a position overlapping the mount area 4.

Figure 7A:
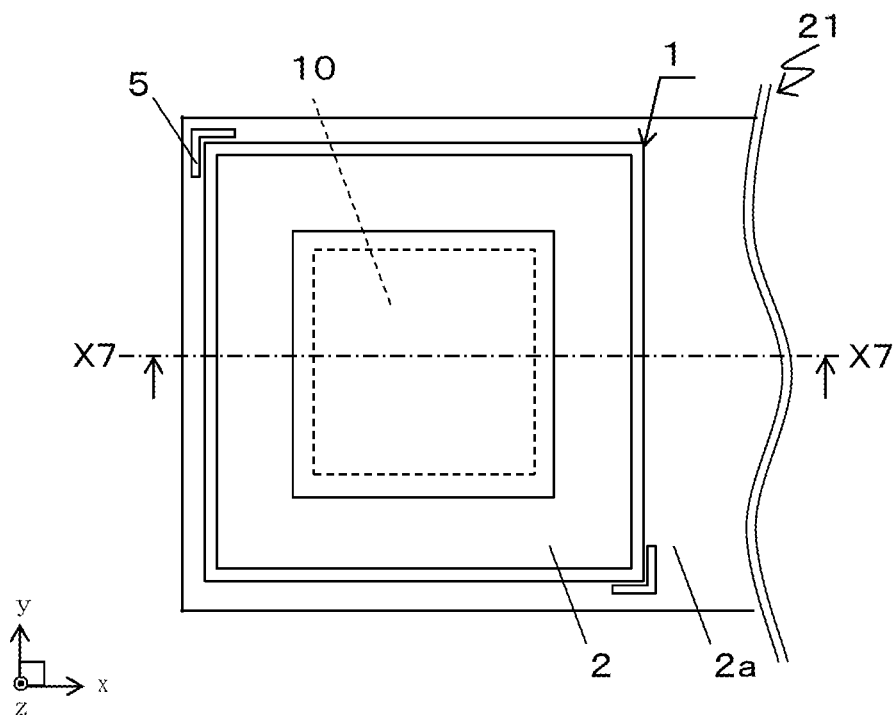
FIG. 7A is an external top view of an electronic component mounting board and an electronic device according to a fifth embodiment of the present invention.
Figure 7B:
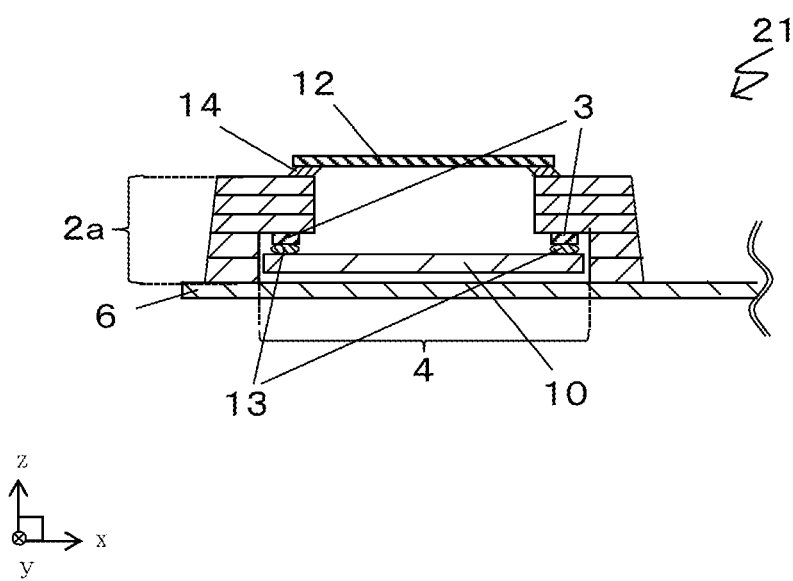
FIG. 7B is a cross-sectional view taken along line X7-X7 in FIG. 7A.

In FIGS. 7A and 7B, the mount area 4 and the electrode pads 3 are located on the lower surface of the substrate 2a, and the substrate 2a has the through-hole at a position overlapping a part of the mount area 4. In this structure, the side surfaces of the substrate 2a slope from the upper end to the lower end of the substrate 2a outside the electrode pads 3 and flare from the upper end to the lower end as viewed from above. The sloping side surfaces reduce shadows produced along the perimeter of the electronic component mounting board 1. This structure prevents the shadow line of the substrate 2a from being misrecognized as the profile line in image recognition for transporting the substrate 2a or in recognition of the outer edge of the substrate 2a for mounting the electronic component 10. This structure reduces mounting failures.

In FIGS. 7A and 7B, the electronic component 10 is an imaging device, such as a CMOS device, having a light-receiving upper surface. In FIGS. 7A and 7B, the substrate 2a has a through-hole. The substrate 2a also has an opening for containing the electronic component 10. In this structure, the substrate 2a can contain the electronic component 10. Thus, the thickness of the electronic device 21 can be reduced. When the electronic component 10 is an imaging device such as a CMOS device, the electronic component 10 is mounted to have the light-receiving upper surface overlapping the through-hole in the substrate 2a as viewed from above. The electronic component 10 (imaging device) may be mounted on the electronic component mounting board 1 with a device bond 13 or, for example, with either gold or solder balls.

The electronic component mounting board 1 may be bonded to another board 6, such as an external circuit board, on the lower surface of the substrate 2a as shown in FIG. 7B or on the upper surface of the substrate 2a. When bonded on the lower surface of the substrate 2a as shown in FIG. 7B, the electronic component 10 may be sealed with the other board 6, the substrate 2a, and the lid 12. The electronic component 10 is thus prevented from directly receiving impact applied through the lower surface of the electronic component mounting board 1 and from deforming or cracking. When the other board 6, such as an external circuit board, is bonded on the upper surface of the substrate 2a, the thickness of the electronic device 21 can further be reduced. The electronic component 10 can also include a heat dissipation member, such as a heat sink, directly bonded to the electronic component 10, improving the heat dissipation efficiency.

In FIG. 7A, the other board 6 includes alignment patterns 5 on its upper surface. As described above, the alignment patterns 5 may be located adjacent to the corners of the electronic component mounting board 1 to be mounted, or at least two patterns may be located diagonally as shown in FIG. 7A. The two diagonally located patterns can be used to detect the electronic component mounting board 1 rotated or misaligned in mounting with respect to the other board 6. In the present embodiment, the side surfaces of the substrate 2a slope from the upper end to the lower end. This structure reduces shadows produced around the substrate 2a, and also prevents the alignment patterns 5 from overlapping the shadows and degrading the mountability, or prevents erroneous detection of an accurately mounted board as being defective.

The other board 6 may be a flexible board. The flexible board as the other board 6 may include a base film. Examples of the material for the base film include an insulator formed from a resin, such as a polyimide film. The other board 6 includes a conductive layer on the upper surface of the base film. The conductive layer contains, for example, copper, aluminum, gold, or nickel, or an alloy containing at least one of these metal materials.

The uncovered surface of the conductive layer may be plated. The plating layer protects the surface of the conductive layer against oxidation. The plating also improves electrical connection between the base 2 and the conductive layer. The plating layer may be, for example, a Ni plating layer with a thickness of 0.5 to 10 µm, and the Ni plating layer may further be coated with a gold (Au) plating layer with a thickness of 0.5 to 3 µm. The plating layer may further be plated with Sn.

The other board 6 includes a cover film located on the upper surface of the conductive layer. The cover film protects the surface of the conductive layer. The film is formed from a resin material, such as a polyimide film, and has a bond applied on one surface. The film is located on the surface of the conductive layer excluding its portions to be electrically connected to the substrate 2a. The other board 6 may be connected to the substrate 2a with a conductive bond.

The bond for bonding the other board 6 and the substrate 2a contains, for example, a material difficult to alter under heat applied during mounting of the electronic component 10. Examples of the bond include a bisphenol A liquid epoxy resin and a polyimide resin. Such a bond member efficiently reduces separation of the other board 6 from the substrate 2a during mounting of the electronic component 10. The bond may be conductive to electrically connect the substrate 2a to the other board 6. Examples of the conductive bond include silver epoxy, solder, an anisotropic conductive resin (anisotropic conductive paste or ACP), and an anisotropic conductive film (ACF).

The electronic component mounting board 1 with the structure shown in FIGS. 7A and 7B is prepared basically with the same method as used for the electronic component mounting board 1 in the fourth embodiment. For example, the electronic component mounting board 1 formed from an electrical insulating ceramic material is obtained by forming a through-hole in each insulating layer at the position to be the through-hole or an opening using a mold, and pressing and stacking the layers to prepare a ceramic green sheet laminate to be the electronic component mounting board 1 shown in FIGS. 7A and 7B, and firing the laminate. The slopes in the side surfaces may be formed in the same manner as described in the fourth embodiment.

The present invention is not limited to the examples described in the above embodiments. All the embodiments according to the present invention may be combined or variously modified, including numerical values, unless any contradiction arises. For example, although the electrode pads 3 are rectangular as viewed from above in the examples shown in FIGS. 1A to 7B, they may be circular or polygonal. In the present embodiment, any number of electrode pads 3 with any shapes may be in any arrangement, and the electrode device may be mounted with any method.

REFERENCE SIGNS LIST 1 electronic component mounting board
2 base
2a substrate
2b frame
3 electrode pad
4 mount area
5 alignment pattern
6 other board
10 electronic component
12 lid
13 device bond
14 lid bond
21 electronic device
31 electronic module
32 housing

What is claimed is:

1. An electronic component mounting board, comprising:
a base formed from a plurality of layers that are layered from a bottom layer to a top layer with respect to a substrate, wherein each of the plurality of layers include a slope that flares from the top layer to the bottom layer as viewed from above;
a mount area that is formed on one of the plurality of layers and in which an electronic component is mountable; and
electrode pads located at ends of the mount area as viewed from above.

2. The electronic component mounting board according to claim 1, wherein:
the base has an upper surface continuous with the side surfaces, and
the upper surface of the base includes the mount area.

3. The electronic component mounting board according to claim 2, further comprising:
a frame located outside the electrode pads and formed on the upper surface of the base, wherein the frame has at least one side surface that slopes from a first end to a second end of the frame, and flares from the first end to the second end as viewed from above.

4. The electronic component mounting board according to claim 3, wherein
the substrate has an outer edge that protrudes outward from an outer edge of the frame as viewed from above.

5. The electronic component mounting board according to claim 2, wherein
the substrate has an outer edge that protrudes outward from an outer edge of the base as viewed from above.

6. The electronic component mounting board according to claim 1, wherein the mounting area is formed on the top layer.

7. The electronic component mounting board according to claim 6, further comprising:
a frame located outside the electrode pads and formed on the top layer, wherein the frame has at least one side surface that slopes from a first end to a second end of the frame, and flares from the first end to the second end as viewed from above.

8. The electronic component mounting board according to claim 7, wherein
the substrate has an outer edge that protrudes outward from an outer edge of the frame as viewed from above.

9. The electronic component mounting board according to claim 6, wherein
the substrate has an outer edge that protrudes outward from an outer edge of the base as viewed from above.

10. The electronic component mounting board according to claim 1, wherein
the substrate has an outer edge that protrudes outward from an outer edge of the base as viewed from above.

11. An electronic device, comprising:
the electronic component mounting board according to claim 1;
an electronic component mounted in the mount area; and
a lid covering the electronic component.

12. An electronic module, comprising:
the electronic device according to claim 11; and
a housing located on an upper surface of the electronic device.

* * * * *